(12) United States Patent
Claridge et al.

(10) Patent No.: US 10,889,669 B2
(45) Date of Patent: Jan. 12, 2021

(54) MODULATING INTERFACIAL WETTABILITY OF A NONCOVALENT NANOSCOPIC LIGAND FILM

(71) Applicant: Purdue Research Foundation, West Lafayette, IN (US)

(72) Inventors: Shelley A. Claridge, Lafayette, IN (US); Jae Jin Bang, West Lafayette, IN (US); Shane Richard Russell, West Lafayette, IN (US); Terry Angelo Villarreal, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 120 days.

(21) Appl. No.: 16/145,279

(22) Filed: Sep. 28, 2018

(65) Prior Publication Data

US 2019/0092885 A1  Mar. 28, 2019

Related U.S. Application Data

(60) Provisional application No. 62/564,325, filed on Sep. 28, 2017.

(51) Int. Cl.
| | | |
|---|---|---|
| *C08F 138/00* | (2006.01) | |
| *C08J 5/18* | (2006.01) | |
| *H01L 51/00* | (2006.01) | |
| *C09J 4/00* | (2006.01) | |
| *C08F 38/00* | (2006.01) | |
| *H01B 1/12* | (2006.01) | |
| *H01L 51/56* | (2006.01) | |

(52) U.S. Cl.
CPC ............ *C08F 138/00* (2013.01); *C08F 38/00* (2013.01); *C08J 5/18* (2013.01); *C09J 4/00* (2013.01); *H01B 1/124* (2013.01); *H01L 51/004* (2013.01); *H01L 51/0012* (2013.01); *C08J 2349/00* (2013.01); *H01L 51/56* (2013.01)

(58) Field of Classification Search
USPC ........................................................ 977/897
See application file for complete search history.

(56) References Cited

PUBLICATIONS

Mann, J.; J. Phys. Chem. Lett. 2013, 4, 2649-2657.
Bang, J. J.; J. Am. Chem. Soc. 2016, 138, 4448-4457.
Li, B.; Nanoscale 2013, 5, 9640-9644.
Cui, D.; Chem. Comm. 2015, 51, 16510-16513.
Li, Z.; Nat. Mater. 2013, 12, 925-931.
Okawa, Y.; Nanoscale 2012, 4, 3013-3028.
Okawa, Y.; J. Chem. Phys. 2001, 115, 2317-2322.
Giridharagopal, R.; ACS Nano 2008, 2, 1571-1580.
Novoselov, K. S. et al., Science 306, 666-669 (2004).
Takami, K.; Surf. Sci. 2005, 591, L273-L279.
Okawa, Y.; J. Am. Chem. Soc. 2011, 133, 8227-8233.
Yang, Y.; Langmuir 2015, 31, 12408-12416.
Choong, S. W.; ACS Appl. Mater. Interf. 2017, 9, 19326-19334.
Neuheuser, T.; J. Phys. Chem. 1994, 98, 6459-6467.
Kim, C.; Nature 2012, 481, 209-213.
Yin, S.; Surf. Interf. Analysis 2001, 32, 248-252.
Bala, T.; J. Phys. Chem. A 2007, 111, 6183-6190.
Phollookin C.; Macromolecules 2010, 43, 7540-7548.

*Primary Examiner* — Fred M Teskin
(74) *Attorney, Agent, or Firm* — Purdue Research Foundation; Liang Zeng Yan (57) ABSTRACT

This invention generally relates to a method for modulating interfacial wettability of a noncovalent nanoscopic monolayer or thin film. Particularly, this invention relates to a method for modulating interfacial wettability of a two-dimensional (2D) material using a molecular layer prepared from a polymerizable amphiphilic monomer having a hydrophilic head and a hydrophobic tail, wherein enhanced or decreased wettability of said 2D material is achieved by proper allocating the position of polymerizable group relative to the hydrophilic head and the hydrophobic tail.

19 Claims, 7 Drawing Sheets

MODULATING INTERFACIAL WETTABILITY OF A NONCOVALENT NANOSCOPIC LIGAND FILM

CROSS-REFERENCE TO RELATED APPLICATIONS

The present U.S. patent application relates to and claims the priority benefit of U.S. Provisional Patent Application Ser. No. 62/564,325, filed Sep. 28, 2017, the content of which is hereby incorporated by reference in its entirety.

GOVERNMENT SUPPORT CLAUSE

This invention was made with government support under grant CHE1555173 awarded by the National Science Foundation. The government has certain rights in the invention.

TECHNICAL FIELD

This invention generally relates to a method for modulating interfacial wettability of a noncovalent nanoscopic monolayer or thin film. Particularly, this invention relates to a method for modulating interfacial wettability of a two-dimensional (2D) material using a molecular layer prepared from a polymerizable amphiphilic monomer having a hydrophilic head and a hydrophobic tail.

BACKGROUND

This section introduces aspects that may help facilitate a better understanding of the disclosure. Accordingly, these statements are to be read in this light and are not to be understood as admissions about what is or is not prior art.

The widespread interest in modulating graphene electronic properties has spurred significant efforts toward ordering noncovalent ligand layers to control molecule-substrate interactions (Mann, J A et al., *J. Phys. Chem. Lett.* 2013, 4, 2649-2657). Ordering ligand to promote specific, spatially-resolved interactions with the environment (e.g. electrodes, optoelectronic active layers, analytes) has gained a growing importance for precisely registered integration into functional devices. Fundamentally, this requires spatial orientation information to be encoded in the ligand layer by displaying two or more different (e.g. wetting-orthogonal) surface chemistries in a controlled way.

While the unusual electronic and mechanical properties of graphene promise substantial benefits to the design of nanoscale device architectures and hybrid materials, processing control remains a substantial barrier in many applications (Mann, J. A. et al., *J. Phys. Chem. Lett.* 2013, 4, 2649-2657; Bang, J. J. et al., *J. Am. Chem. Soc.* 2016, 138, 4448-4457; Li, B. et al., *Nanoscale* 2013, 5, 9640-9644). Significant challenges arise from the concurrent need to control both the electronic properties of the 2D layer of material and environmental interactions. The methods and processes disclosed herein may offer a solution to those unmet needs.

BRIEF SUMMARY OF INVENTIONS

This invention generally relates to a method for modulating interfacial wettability of a noncovalent nanoscopic film. In particular this invention relates to a method for modulating interfacial wettability of a two-dimensional (2D) material using a molecular layer prepared from a polymerizable amphiphilic monomer having a hydrophilic head and a hydrophobic tail, wherein enhanced or decreased wettability of said 2D material is achieved by proper allocating the position of polymerizable group relative to the hydrophilic head and the hydrophobic tail.

In some aspects, this invention relates to a method for modulating interfacial wettability of a 2D material prepared from a vicinal diyne amphiphilic monomer having a hydrophilic head and a hydrophobic tail comprising the step of allocating position of said vicinal polymerizable diyne functionality whereby an enhanced or decreased wettability of said 2D material is achieved after polymerization.

In some other aspects, this present invention relates to a method for modulating interfacial wettability of a 2D material prepared from a polymerizable vicinal diyne amphiphilic monomer having a hydrophilic head and a hydrophobic tail, wherein said hydrophilic head is a carboxylic acid, comprising the step of pH adjustment and/or chelating said carboxylic acid functionality with a divalent cation whereby an enhanced or decreased wettability of said 2D material is achieved after polymerization of the amphiphilic monomer.

Yet in some other aspects, this invention relates to a product, such as a monolayer or thin film, or a device incorporated such a monolayer or thin film, prepared according to the methods disclosed herein.

BRIEF DESCRIPTION OF THE DRAWINGS

Embodiments of the present disclosure will now be described by way of example in greater detail with reference to the attached Figs., in which:

FIG. 2D depicts the structure of oligomerizing 4,6-PCDA; FIGS. 2C and 2D illustrate differences in chain-chain interactions based on segment length;

DETAILED DESCRIPTION

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure the term "about" can allow for a degree of variability in a value or range, for example, within 20%, within 10%, within 5%, or within 1% of a stated value or of a stated limit of a range.

In the present disclosure the term "substantially" can allow for a degree of variability in a value or range, for example, within 70%, within 80%, within 90%, within 95%, or within 99% of a stated value or of a stated limit of a range.

As used herein, an "amphiphile" is defined as a chemical compound comprising both hydrophilic and hydrophobic constituents.

As used herein, a "thin film" is defined as a layer of material ranging from less than 1 nm to several thousand nanometers in thickness.

As used herein, a "polymerizable group" is defined as a functional group that can polymerize to afford a polymer with a trigger or an initiator, which can be a chemical, heating, light, etc. Specific examples provided in this disclosure are a carbon-carbon triple bond.

A layered, or two-dimensional (2D) material generally has a layer of thickness between one atomic layer and a few nm. Even though the existence of two-dimensional materials have been theorized since the 1940's (Wallace, P. R. The band theory of graphite. Phys. Rev. 71, 622-634 (1947)), it was not until 2004 that it was shown that these materials can be stable as freestanding sheets, by the isolation of individual graphene sheets (Novoselov, K. S. et al., Science 306, 666-669 (2004)). Layers may be stacked to form macroscopic materials; for instance, highly oriented pyrolytic graphite (HOPG) consists of stacks of graphene layers.

The term "nanoscopic" scale (or nanoscale) refers to a structure with a length scale applicable to nanotechnology, usually cited as 1-100 nanometers (Hornyak, Gabor L. (2009). Fundamentals of Nanotechnology. Boca Raton, Fla.: Taylor & Francis Group). For technical purposes, the nanoscopic scale is the size at which fluctuations in the averaged properties (due to the motion and behavior of individual particles) begin to have a significant effect (often a few percent) on the behavior of a system, and must be taken into account in its analysis. The nanoscopic scale is sometimes marked as the point where the properties of a material change; above this point, the properties of a material are caused by 'bulk' or 'volume' effects, namely which atoms are present, how they are bonded, and in what ratios. Below this point, the properties of a material change, and while the type of atoms present and their relative orientations are still important, 'surface area effects' become more apparent, which, at these low dimensions, can have a drastic effect on quantized states, and thus the properties of a material. The term "nanoscopic thickness" refers to a thickness of nanoscopic scale.

This invention generally relates to a method for modulating interfacial wettability of a noncovalent nanoscopic film. In particular this invention relates to a method for modulating interfacial wettability of a two-dimensional (2D) material using a molecular layer prepared from a polymerizable vicinal diyne amphiphilic monomer having a hydrophilic head and a hydrophobic tail comprising the step of allocating position of the polymerizable vicinal diyne functionality, or adjusting the pH value, or chelating the carboxylic acid functionality of the hydrophilic head with a divalent cation, whereby an enhanced or decreased wettability of said 2D material is obtained after polymerization.

In some illustrative embodiments, this invention relates to a method for modulating interfacial wettability of a two-dimensional (2D) material using a molecular layer prepared from a polymerizable amphiphilic monomer having a hydrophilic head and a hydrophobic tail, the method comprising the steps of a. preparing an amphiphilic monomer, allocating a proper position for the polymerizable group, relative to the hydrophilic head and the hydrophobic tail of said amphiphilic monomer;

b. assembling a monolayer or thin film of said amphiphilic monomer; and c. polymerizing said amphiphilic monomer whereby affording said 2D material with enhanced or decreased wettability.

In some other illustrative embodiments, this invention relates to a method for modulating interfacial wettability of a 2D material using a molecular layer prepared from a polymerizable amphiphilic monomer as disclosed herein, wherein said amphiphilic monomer incorporates a vicinal diyne.

In some other illustrative embodiments, this invention relates to a method for modulating interfacial wettability of a 2D material using a molecular layer prepared from a polymerizable amphiphilic monomer as disclosed herein, wherein said proper position for the polymerizable group relates to its position relative to said hydrophobic tail and hydrophilic head, which creates a proximal alkyl chain segment connecting the polymerizable group and the hydrophilic head, and a terminal chain segment connecting the polymerizable group and the end of the hydrophobic tail.

In some other illustrative embodiments, this invention relates to a method for modulating interfacial wettability of a 2D material using a molecular layer prepared from a polymerizable amphiphilic monomer as disclosed herein, wherein decreased wettability is achieved when said hydrophobic tail has an about ten-carbon linear terminal alkyl chain segment.

In some other illustrative embodiments, this invention relates to a method for modulating interfacial wettability of a 2D material using a molecular layer prepared from a polymerizable amphiphilic monomer as disclosed herein, wherein enhanced wettability is achieved by controlling the relative lengths of the proximal and terminal alkyl chain of said hydrophobic tail such that the hydrophilic head groups are disordered by the polymerization process.

In some other illustrative embodiments, this invention relates to a method for modulating interfacial wettability of a 2D material using a molecular layer prepared from a polymerizable amphiphilic monomer as disclosed herein, wherein disordering the hydrophilic head groups is achieved by positioning the polymerizable group of said amphiphilic monomer close to said head groups.

In some other illustrative embodiments, this invention relates to a method for modulating interfacial wettability of a 2D material using a molecular layer prepared from a polymerizable amphiphilic monomer as disclosed herein, wherein polymerization of an amphiphilic monolayer or thin film is performed by irradiating the monolayer or thin film with an UV light.

In some illustrative embodiments, this invention relates to a monolayer or thin film prepared according to the method disclosed herein.

In some other illustrative embodiments, this invention relates to a monolayer or thin film prepared according to the steps of
   a. preparing an amphiphilic monomer, allocating a proper position for the polymerizable group, relative to the hydrophilic head and the hydrophobic tail of said amphiphilic monomer;
   b. assembling a monolayer or thin film of said amphiphilic monomer; and
   c. polymerizing said amphiphilic monomer whereby affording said 2D material with enhanced or decreased wettability.

In some illustrative embodiments, this invention relates to a device containing the monolayer or thin film prepared according to the method disclosed herein.

In some illustrative embodiments, this invention relates to a monolayer or thin film prepared according to the method disclosed herein, wherein said monolayer or thin film is transferrable.

In some illustrative embodiments, this invention relates to a monolayer or thin film prepared according to the method disclosed herein, wherein said monolayer or thin film is used to create a stacked film for an organic light emitting diode.

In some illustrative embodiments, this invention relates to a monolayer or thin film prepared according to the method disclosed herein, wherein said monolayer or thin film is used to control orientation and/or phase segregation in a photovoltaic or wearable device.

In some illustrative embodiments, this invention relates to a monolayer or thin film prepared according to the method disclosed herein, wherein said monolayer or thin film is used as a template for an electronic device.

In some other illustrative embodiments, this invention relates to a method for modulating interfacial wettability of a 2D material using a molecular film prepared from a vicinal diyne amphiphilic monomer having a hydrophilic head and a hydrophobic tail, wherein said hydrophilic head is a carboxylic acid, the method comprising the steps of
   a. preparing a vicinal diyne amphiphilic monomer having a hydrophilic head and a hydrophobic tail;
   b. assembling a monolayer or thin film of said amphiphilic monomer;
   c. polymerizing said monolayer or thin film whereby affording a 2D material with enhanced or decreased wettability; and
   d. optionally adjusting pH of said amphiphilic monolayer and/or chelating said carboxylic acid functionality with a divalent cation to further control head group ordering.

In some other illustrative embodiments, this invention relates to a method for modulating interfacial wettability of a 2D material using a molecular film prepared from a vicinal diyne amphiphilic monomer having a hydrophilic head and a hydrophobic tail, wherein reduced wettability (enhanced hydrophobicity) of said 2D material is achieved by adjusting said pH value downward using an acid.

In some other illustrative embodiments, this invention relates to a method for modulating interfacial wettability of a 2D material using a molecular film prepared from a vicinal diyne amphiphilic monomer having a hydrophilic head and a hydrophobic tail, wherein increased wettability (enhanced hydrophilicity) of said 2D material is achieved by adjusting said pH value upward using a base.

In some other illustrative embodiments, this invention relates to a method for modulating interfacial wettability of a 2D material using a molecular film prepared from a vicinal diyne amphiphilic monomer having a hydrophilic head and a hydrophobic tail, wherein enhanced hydrophobicity (reduced wettability) of said 2D material is achieved by adding a divalent cation to chelate said carboxylic acid functionality.

In some other illustrative embodiments, this invention relates to a method for modulating interfacial wettability of a 2D material using a molecular film prepared from a vicinal diyne amphiphilic monomer having a hydrophilic head and a hydrophobic tail, wherein enhanced hydrophobicity (reduced wettability) of said 2D material is achieved by adding a divalent cation selected from the group consisting of $Ca^{2+}$, $Mg^{2+}$, $Ba^{2+}$, $Cu^{2+}$, $Co^{2+}$, $Ni^{2+}$, $Zn^{2+}$, $Mn^{2+}$, $Pb^{2+}$, $Cd^{2+}$, and $Fe^{2+}$.

In some other illustrative embodiments, this invention relates to a method for modulating interfacial wettability of a 2D material using a molecular film prepared from a vicinal diyne amphiphilic monomer having a hydrophilic head and a hydrophobic tail, wherein polymerization of an amphiphilic monolayer or thin film is performed by irradiating said monolayer or thin film with an UV light.

In some other illustrative embodiments, this invention relates to a monolayer or thin film prepared according to the steps of
   a. preparing a vicinal diyne amphiphilic monomer having a hydrophilic head and a hydrophobic tail;
   b. assembling a monolayer or thin film of said amphiphilic monomer;
   c. polymerizing said monolayer or thin film whereby affording a 2D material with enhanced or decreased wettability; and
   d. optionally adjusting pH of said amphiphilic monolayer and/or chelating said carboxylic acid functionality with a divalent cation to further control head group ordering.

In some other illustrative embodiments, this invention relates to a monolayer or thin film prepared according to the method disclosed herein, wherein said monolayer or thin film is used to create a stacked film for an organic light emitting diode.

In some other illustrative embodiments, this invention relates to a monolayer or thin film prepared according to the method disclosed herein, wherein said monolayer or thin film is used to control orientation and/or phase segregation in a photovoltaic or wearable device.

In some other illustrative embodiments, this invention relates to a monolayer or thin film prepared according to the method disclosed herein, wherein said monolayer or thin film is used as a template for an electronic device.

In some illustrative embodiments, this invention relates to a method for modulating interfacial wettability of a 2D material of a polymerizable vicinal diyne amphiphile having a hydrophilic head and a hydrophobic tail, wherein an enhanced hydrophobicity (reduced wettability) of said 2D material is achieved by adding a divalent cation selected from the group consisting of $Ca^{2+}$, $Mg^{2+}$, $Ba^{2+}$, $Cu^{2+}$, $Co^{2+}$, $Ni^{2+}$, $Zn^{2+}$, $Mn^{2+}$, $Pb^{2+}$, $Cd^{2+}$, and $Fe^{2+}$.

In some illustrative embodiments, this invention relates to a method for modulating interfacial wettability of a 2D material using a monolayer prepared from a polymerizable vicinal diyne amphiphilic monomer having a hydrophilic head and a hydrophobic tail, wherein polymerization of an amphiphilic monolayer or thin film is performed by irradiating the monolayer with an UV light.

It will be appreciated by persons skilled in the art that the present invention is not limited by what has been particularly shown and described herein. The details of one or more embodiments of the invention are set forth in the accompanying the description below. Other features, objects, and advantages of the invention will be apparent from the description and drawings, and from the claims.

Figure 1A:
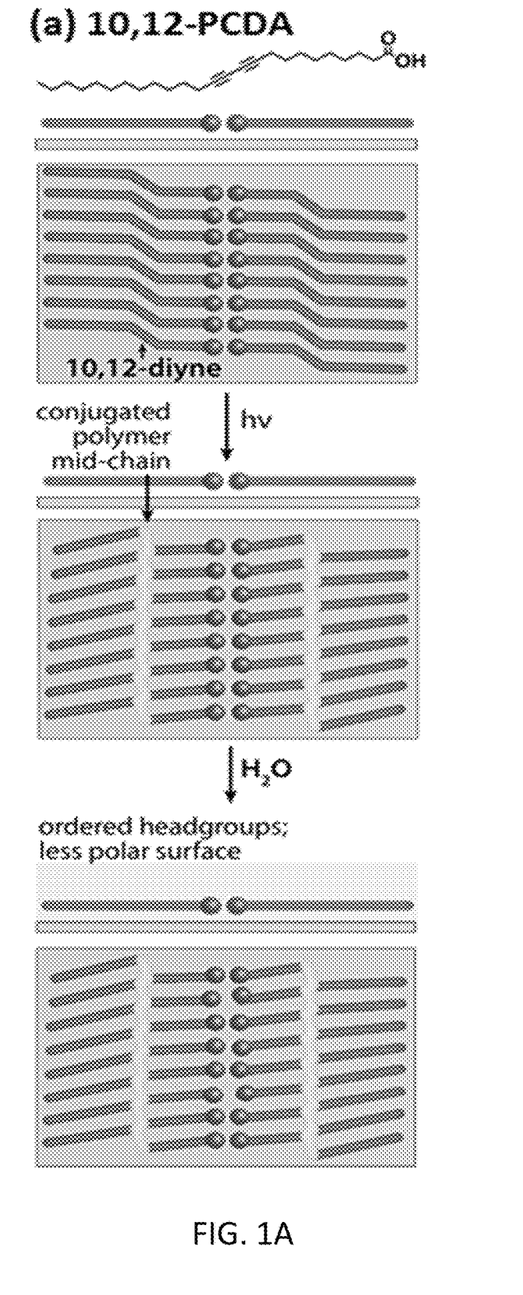
FIG. 1A illustrates a noncovalent functionalization using monolayers of polymerized diynoic acids 10,12-PCDA (10, 12-pentacosadiynoic acid)
Figure 1B:
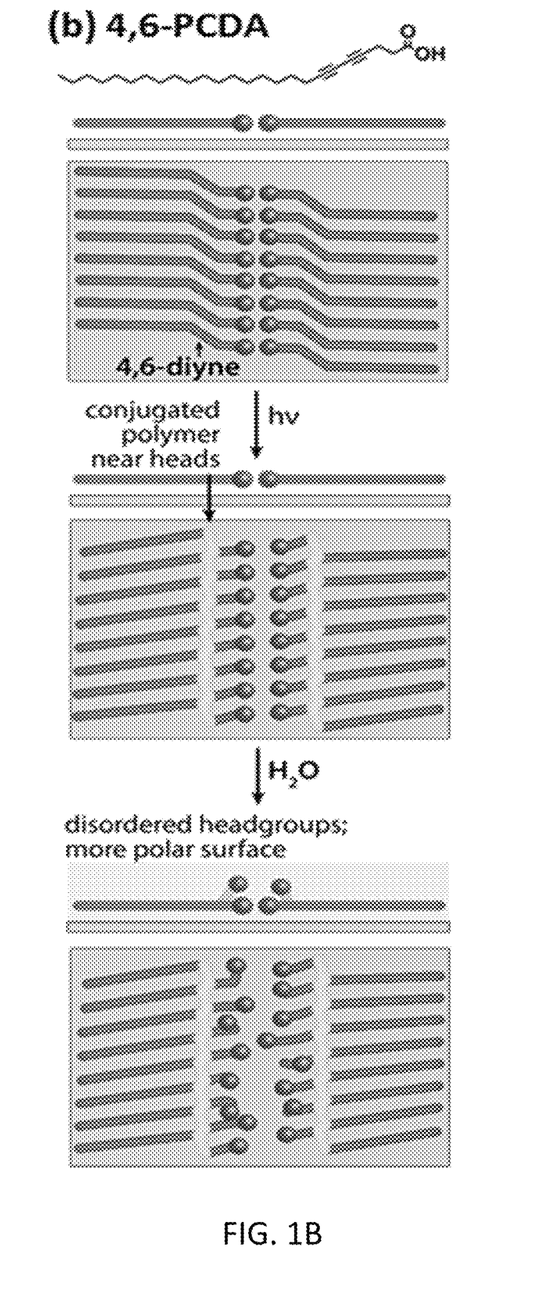
FIG. 1B illustrates a noncovalent functionalization using monolayers of polymerized diynoic acids 4,6-PCDA (4,6-pentacosadiynoic acid), and the impact on interfacial wettability.

Long-chain diynoic acids such as 10,12-pentacosadiynoic acid (10,12-PCDA, FIGS. 1A and 1B) have a number of structural features that contribute to their utility in noncovalent functionalization. Epitaxy between the alky chain and the substrate lattice promotes assembly of ordered lamellar phases on highly ordered pyrolytic graphite (HOPG) and other layered materials (Okawa, Y. et al., *Nanoscale* 2012, 4, 3013-3028; Giridharagopal, R., et al., *ACS Nano* 2008, 2, 1571-1580). Adjacent molecular rows adopt a head-to-head orientation, forming hydrogen bonded carboxylic acid dimers between rows that increase monolayer stability (FIGS. 1A and 1B, top panel). Ordered diynes undergo topochemical photopolymerization when exposed to UV radiation forming a conjugated ene-yne polymer backbone that connects molecules along the lamellar axis (FIGS. 1A and 1B, middle panel) (Wegner, G. *J. Polym. Sci., Part B: Polym. Lett.* 1971, 9, 133-144). A substantial body of work has explored the use of the conjugated ene-yne as a molecular wire; the use of the headgroups for interfacial chemical patterning has also been examined (Yang, Y., et al., *Langmuir* 2015, 31, 12408-12416).

Polymerization also increases the stability of ene-yne monolayers toward removal or exchange of solvent suggesting utility in controlling 2D material surface chemistry during solution processing (Bang, J. et al., *J. Am. Chem. Soc.* 2016, 138, 4448-4457; Choong, S. et al., *ACS Appl. Mater. Interf.* 2017, 9, 19326-19334). Recently, we have demonstrated that HOPG functionalized with polymerized lying-down monolayers of 10,12-PCDA (poly-10,12-PCDA) exhibits surface wettability that titrates with ionization of the carboxylic acid headgroups. Because the carboxylic acids are situated directly adjacent to the relatively nonpolar HOPG substrate, ionization is somewhat restricted, with a $pK_{1/2}$ of ~9.5 for poly-10,12-PCDA assembled in the monolayer, in comparison with a $pK_a$~4.7 for acetic acid in dilute aqueous solution (Bang, J. et al., *J. Am. Chem. Soc.* 2016, 138, 4448-4457). Substantial differences in ionization behavior were associated with positioning the functional group even a few Ångströms away from the nonpolar graphite interface, using a polymerizable phospholipid scaffold. Thus, conformational dynamics in noncovalent monolayers are likely to have substantial impacts on the chemistry of the interface.

In the context of understanding monolayer behavior during solution processing, these observations raise two important questions related to the noncovalent molecule-substrate interaction: First, what is the structure of the noncovalently adsorbed monolayer as it interacts with a polar solvent (FIGS. 1A and 1B, bottom panel), particularly at pH >$pK_{1/2}$. In the absence of polar solvents, carboxylic acids form strong hydrogen-bonded dimer structures, tethering the functional groups in the plane of the monolayer. However, ionization of more than half of the carboxylic acids in the monolayer requires ionizing facing carboxylic acid groups that dimerize when neutral, creating local charge densities as great as $4e/nm^2$ if the headgroups remain in-plane. Because the alkyl chains are not covalently bound to the substrate, this suggests the possibility of substantial conformational dynamics in the monolayer to reduce Coulombic repulsion between charged headgroups. Although COOH dimers are typically fairly strong (e.g. ~15 kcal/mol for formic acid dimers. See Neuheuser, T., et al., *J. Phys. Chem.* 1994, 6459-6467), it is also possible that headgroup dynamics play a significant role in wetting at lower pH values in cases in which polymerization produces headgroup alignments that are not conducive to hydrogen bonding.

A second question regards control: is it possible to design noncovalent monolayers in which headgroup dynamics are either emphasized (for instance by weakening molecule-molecule interactions), or modulated through interactions with binding partners in the environment? Such capabilities would add important new functionality to monolayer chemistries commonly utilized in noncovalent functionalization of 2D materials.

Useful lessons may be learned in this regard from the cell membrane, which must also precisely tailor a hydrophobic-hydrophilic interface of central biological importance. In the membrane, flexible, dynamic behaviors are produced in response to external stimuli, frequently based on noncovalent assembly motifs, with structural similarities to those utilized here. For instance, one common class of membrane integrative motifs involves 'snorkeling' of basic amino acids such as lysine and arginine, which have side chains comprising a flexible alkyl chain and a charged terminal functional group. The flexible positioning conferred by the alkyl chain enables the basic functional group to snorkel from the nonpolar membrane interior into the polar periphery. There, it docks with negatively charged phosphate groups, anchoring hydrophobic segments of the peptide into the bilayer with striking spatial precision. This motif has been observed in apolipoproteins, the Sec61 translocon, and transmembrane integrins (Kim, C. et al., *Nature* 2012, 481, 209-213).

Here, we demonstrate control over analogous dynamics in lying-down monolayers of polymerizable amphiphiles, based on the position of the diyne functionality. In contrast with commonly used commercially available diynoic acids, in which the internal diyne is positioned centrally, monolayers with diynes positioned close to the carboxylic acid headgroup (creating an alkyl segment similar in length to a lysine side chain) exhibit wetting behavior consistent with a much higher degree of headgroup dynamics across the tested pH range. Conversely, divalent cations that form complexes with carboxylates decrease headgroup dynamics. Flexibility arising from the noncovalent interface structure promises the ability to tailor interfacial wetting and localize interactions with the environment at extremely short length scales (<10 nm) relevant to emerging challenges in fabrication of nanoscale device architectures.

Results and Discussion

Molecular dynamics simulations of relationship between diyne position and headgroup dynamics. Energy minimization and molecular dynamics simulations (FIGS. 2A-2E) were used to predict behavior of lying-down monolayers with differences in the position of the polymer backbone. FIGS. 2A-2E compare the behavior of poly-10,12-PCDA (in which the polymer backbone is located near the midpoint of the alkyl chain) with that of poly-4,6-PCDA (in which the polymer is positioned near the headgroups). Structures were minimized with explicit water molecules near the headgroups, to simulate surface conditions under ambient atmosphere. Prior to polymerization, monolayers of 4,6-PCDA and 10,12-PCDA both exhibit extensive inter-lamellar hydrogen bonding, with the average distance between terminal carbons slightly greater for 4,6-PCDA (4.3±0.2 Å) than for 10,12-PCDA (3.9±0.1 Å), consistent with reduced ordering of the short proximal chain segments. After polymerization, the average distance between terminal carbons increases to 6.8±0.7 Å for 4,6-PCDA; for 10,12-PCDA, two approximately equal populations exist, with average distances of 4.0±0.2 Å (termini that retain hydrogen bonding) and 6.2±0.5 Å (termini that do not).

Figure 2A:
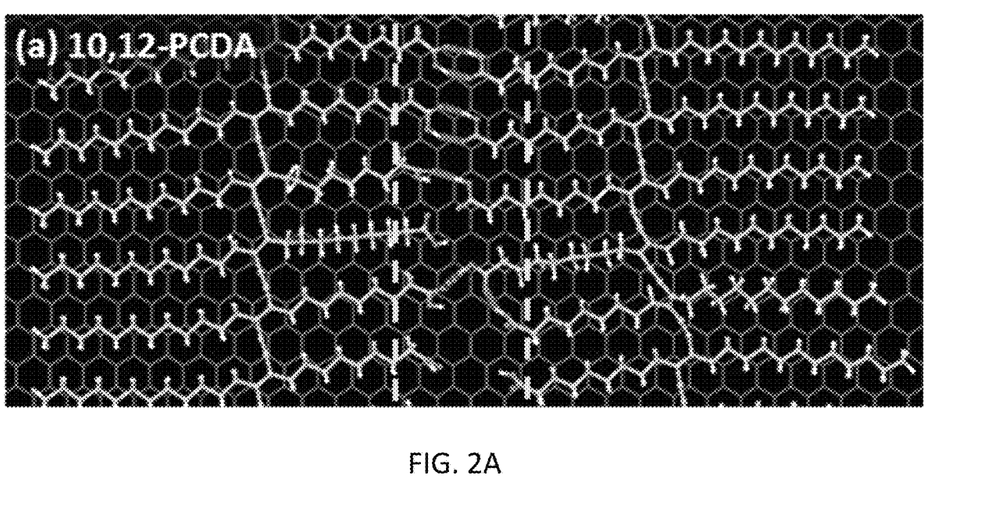
FIG. 2A depicts minimized molecular models of (a) poly-10,12-PCDA.
Figure 2B:
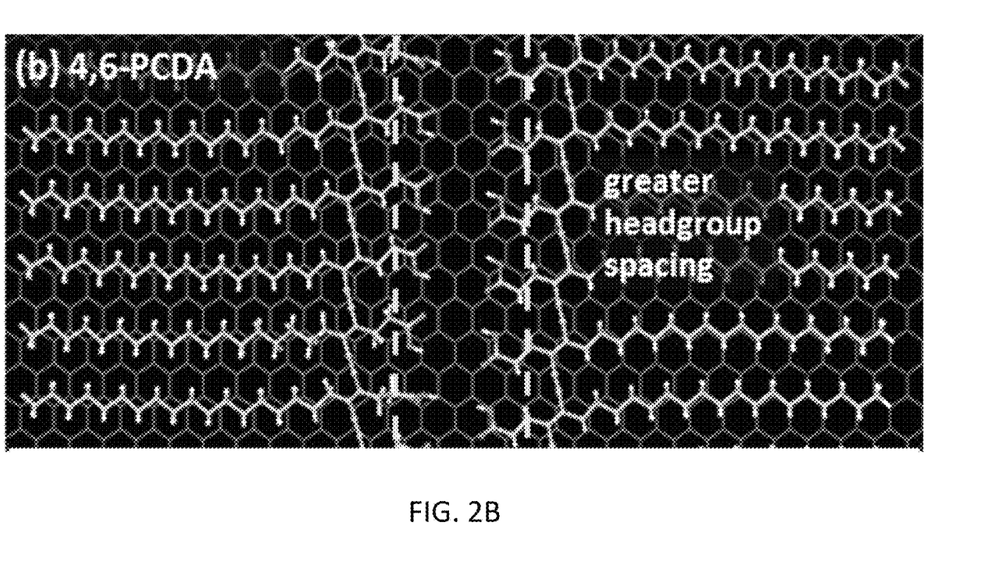
FIG. 2B depicts minimized molecular models of poly-4,6-PCDA illustrating differences in headgroup positioning after polymerization.
Figure 2C:
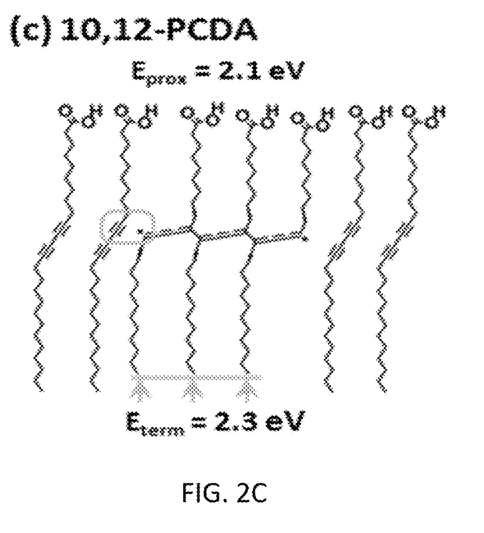
FIG. 2C depicts the structure of oligomerizing 10,12-PCDA.
Figure 2D:
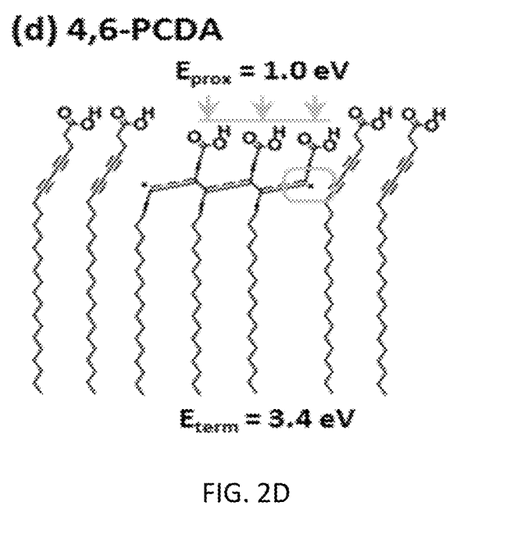
Figure 2E:
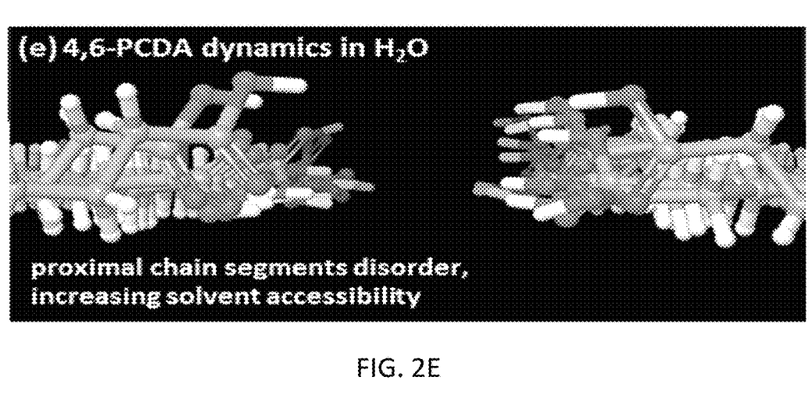
FIG. 2E shows the molecular model of poly-4,6-PCDA headgroups after dynamics simulations in explicit water.

This difference can be rationalized by considering the conformational change that must occur along each lamella as the diyne rehybridizes to form the ene-yne (FIGS. 2C and 2D). Formation of either the raised backbone structure commonly attributed to 10,12-PCDA or the energetically similar in-plane polymer backbone decreases the head-to-tail distance. Thus, either the proximal or terminal chain segment (or both) must shift relative to the substrate lattice.

Here, differences in the proximal and terminal chain lengths determine whether the terminal section shifts (retaining COOH headgroup interactions between rows), or the proximal segment shifts (breaking inter-row dimers and forming catenated hydrogen bonds along the lamellar row). In the unpolymerized monolayer, proximal and terminal chain segment interactions are estimated using values as follows: CH2 . . . π (125 meV), CH2 . . . CH2 (63 meV), and COOH . . . COOH (625 meV, based on formic acid dimer) (See Yin, S. et al., *Surf. Inerf. Anal.* 2001, 32, 248-252; Neuheuser, T., et al., *J. Phys. Chem.* 1994, 6459-6467). This estimation yields similar segmental interaction values for 10,12-PCDA ($E_{prox}$(10,12-PCDA)=2.1 eV, $E_{term}$(10,12-PCDA)=2.3 eV), consistent with the two classes of endgroup motion observed in the minimized models. Conversely for 4,6-PCDA, terminal segment interactions are substantially stronger than those of the proximal segment ($E_{prox}$(4,6-PCDA)=1.0 eV, $E_{term}$(4,6-PCDA)=3.4 eV), consistent with the modeled proximal segment motion.

Molecular dynamics simulations in a full multi-layer of explicit water (FIG. 2E), similar to the surface environment during contact angle measurements, show the impact of reduced chain and headgroup ordering on poly-4,6-PCDA interactions with solvent. In the side view of the monolayer shown, the first and second carbons in several of the alkyl chain are elevated above the HOPG surface. This orientational change, in combination with the lack of appropriately positioned COOH dimerization partners, would be expected to increase surface hydrophilicity relative to monolayers of poly-10,12-PCDA, which retain significant interlamellar headgroup interactions.

Figure 3A:
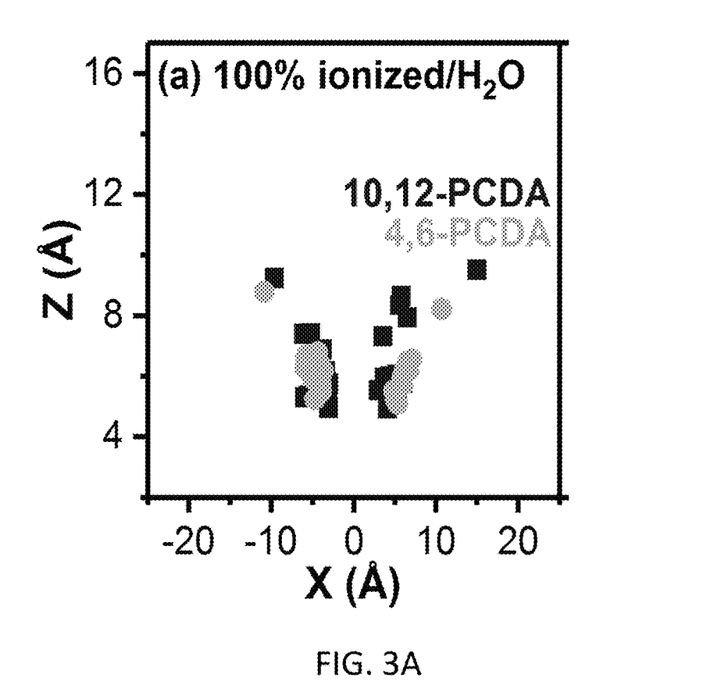
FIG. 3A shows calculated positions of carboxylic acid carbons in poly-4,6-PCDA and poly-10,12-PCDA monolayers after molecular dynamics with headgroups ionized to carboxylates in explicit $H_2O$.
Figure 3B:
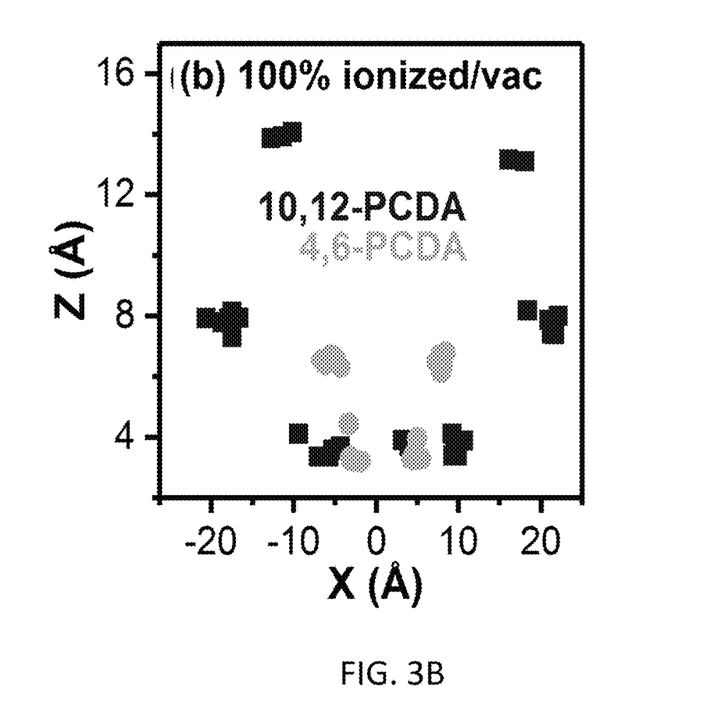
FIG. 3B shows calculated positions of carboxylic acid carbons in poly-4,6-PCDA and poly-10,12-PCDA monolayers after molecular dynamics with headgroups ionized to carboxylates in vacuum.

Molecular dynamics simulations of poly-4,6- and poly-10,12-PCDA monolayers in which all termini have been ionized to carboxylates reveal similar distributions of headgroup positions when dynamics are simulated in explicit water (FIG. 3A); this similarity suggests the likelihood of comparable contact angles for the two monolayer chemistries at pH values high enough to ionize the majority of the headgroups. Graphs in FIGS. 3A and 3B show the positions of carboxylic acid carbons, with the zero point of the X axis taken to be the midpoint of the headgroup rows (e.g. midway between the dashed white lines in FIGS. 2A-2B), and the Z coordinate taken to be the height above the HOPG basal plane, similar to the view shown in FIG. 2E. Dynamics calculated in vacuum (FIG. 3B) illustrate the restricted range of motion for poly-4,6-PCDA headgroups (yellow circles) in comparison with poly-10,12-PCDA (blue squares). While headgroup motion this extensive is unlikely when the surface is solvated, it gives insight into the greater variability in dynamics possible for 10,12-PCDA headgroups under a receding solvent front, relevant in interpreting receding contact angle measurements.

Synthesis of 4,6-pentacosadiynoic acid (4,6-PCDA). To test the effects of proximal chain length on wetting properties experimentally, 4,6-PCDA was prepared by coupling a terminal iodoalkye to an ω-alkynyl carboxylic acid under Cadiot-Chodkewicz cross-coupling conditions (Scheme 1 below). Synthetic protocols are described in detail in the experimental section.

Scheme 1.
Synthesis of 4,6-PCDA.

Contact angle titrations of diynoic acid monolayers on HOPG. Diynoic acids were assembled on HOPG via Langmuir-Schaefer transfer (Langmuir, I. et al., *J. Am. Che. Soc.* 1938, 60, 1351-1360), utilizing conditions demonstrated previously to result in formation of well-ordered lying-down monolayers (Bang, J., *J. Am. Che. Soc.* 2016, 138, 4448-4457). Monolayers were polymerized by UV irradiation and imaged by atomic force microscopy to confirm coverage. Wetting properties of the interfaces were characterized utilizing contact angle titrations. If the chains in monolayers of both monomeric and polymerized 10,12-PCDA and 4,6-PCDA were oriented in true lying-down phases, with alkyl chains parallel to the surface resulting in similar headgroup alignment, then the Young-Dupré equation would predict similar contact angles for the monolayers. That is, the fractions of the surface occupied by alkyl chains ($f_{alkyl}$) and carboxylic acid groups ($f_{COOH}$) and the contact angles of the alkyl chains ($\theta_{alkyl}$) and the carboxylic acid stripes ($\theta_{COOH}$) should be similar, producing comparable values of $\theta_{10,12\text{-}PCDA}$, $\theta_{4,6\text{-}PCDA}$, $\theta_{poly\text{-}10,12\text{-}PCDA}$ and $\theta_{poly\text{-}4,6\text{-}PCDA}$:

$$(1+\cos\theta_{PCDA})^2 = f_{alkyl}(1+\cos\theta_{alkyl})^2 + f_{COOH}(1+\cos\theta_{COOH})^2$$

Figure 4A:
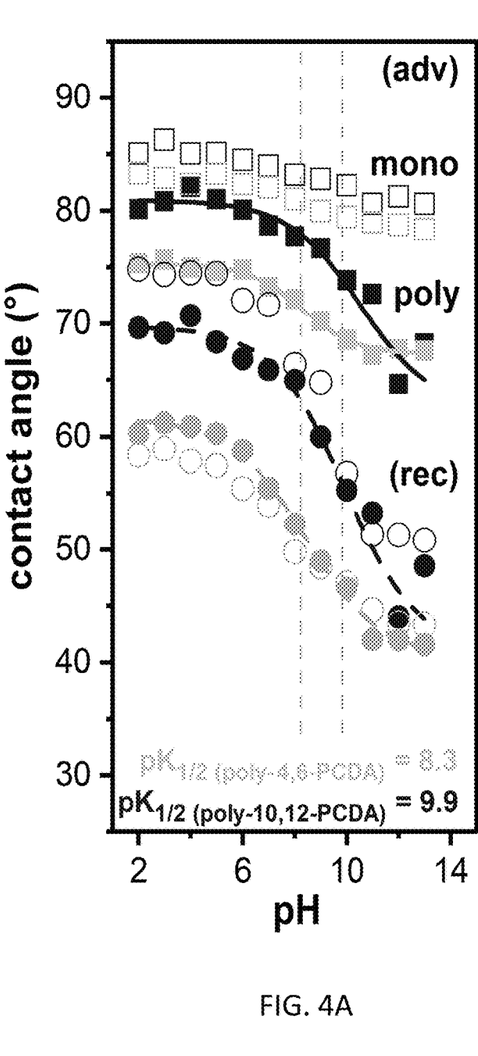
FIG. 4A shows contact angle titration curves for HOPG surfaces functionalized with: unpolymerized 4,6-PCDA (open gold markers), polymerized 4,6-PCDA (closed gold markers), unpolymerized 10,12-PCDA (open blue markers), and polymerized 10,12-PCDA (closed blue markers). Square markers indicate data for advancing angle (adv) measurements; circles indicate data for receding angles (rec)
Figure 4B:
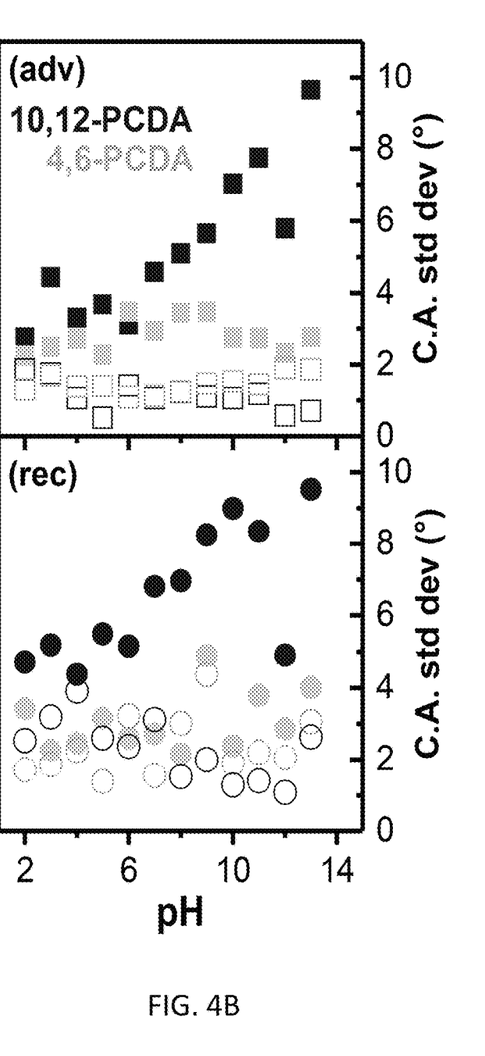
FIG. 4B shows the standard deviations of the contact angles for advancing angle (adv) measurements (top right pane) and receding angle (rec) measurements (bottom right panel), which we plotted separately so it was easier to see the differences by molecule. Square markers indicate data for advancing angle (adv) measurements; circles indicate data for receding angles (rec)

However, experimentally we observe differences in wetting behavior based on both diyne position and polymerization state, consistent the molecular models above. Unpolymerized models suggested slightly weaker interlamellar headgroup interactions for 4,6-PCDA compared with 10,12-PCDA. Experimentally, advancing contact angles (adv) for unpolymerized 4,6-PCDA (FIG. 4A, open gold squares) are ~2° lower than those for 10,12-PCDA (open blue squares). These values would be consistent with 4,6-PCDA headgroups experiencing slightly increased interactions with the solvent due to weaker interlamellar interactions. For better comparison, FIG. 4B shows the standard deviations of the contact angles for advancing angle (adv) measurements (top right pane) and receding angle (rec) measurements (bottom right panel), which we plotted separately so it was easier to see the differences by molecule. Square markers indicate data for advancing angle (adv) measurements; circles indicate data for receding angles (rec).

Polymerization was predicted to partially disrupt interlamellar headgroup interactions for 10,12-PCDA, and to completely disrupt interactions for 4,6-PCDA. Experimentally, we observe a 4° decrease in advancing angles for 10,12-PCDA upon polymerization (filled blue squares) and an 8° decrease for poly-4,6-PCDA (filled gold squares), in the low pH range in which headgroups are predominantly neutral. At high pH values at which Coulombic interactions between ionized headgroups become significant, contact angles become more similar for the two molecules, consistent with the distributions of headgroup positions predicted in FIG. 3A. Although both molecules exhibit high solid-state polymerization efficiencies, 4,6-PCDA is somewhat more reactive, so a higher polymerization yield may also contribute to the decrease in advancing contact angle. Direct yield comparisons are complicated by the headgroup disordering and in-plane polymer backbone of 4,6-PCDA, which impede characterization by STM.

Measuring receding contact angles introduces additional forces at the interface, as the receding solvent front breaks intermolecular contacts with the surface. Polymerization of 10,12-PCDA induces a decrease (~5°) in receding angles (open and closed blue circles) at low pH, similar to observed decrease in advancing angles. In contrast, receding angles for 4,6-PCDA change very little with polymerization (open and closed gold circles). This may mean that interlamellar headgroup interactions for unpolymerized 4,6-PCDA are already sufficiently weak that the headgroups undergo dynamics in response to the receding solvent front.

Sigmoidal curve fits for the two molecules also indicate differences in the ionization midpoint of the two molecules: $pK_{1/2}$(poly-4,6-PCDA)=8.3, substantially lower than $pK_{1/2}$(poly-10,12-PCDA)=9.9. Disordering and greater solvent accessibility are consistent with ionization of the headgroups at lower pH values for poly-4,6-PCDA, as some groups project into the polar solvent environment.

Variability in the contact angle measurements is also consistent with a model in which headgroup dynamics are influenced by the chain length proximal to the headgroup. While the standard deviation in the contact angle measurements is similar in the low pH range (2-4°) for poly-4,6-PCDA and poly-10,12-PCDA, the standard deviation in contact angles rises to nearly 10° for poly-10,12-PCDA at high pH values, suggesting a much greater range of headgroup dynamics for ionized (vs. neutral) poly-10,12-PCDA headgroups. In contrast, the standard deviation for poly-4,6-PCDA remains similar across the pH range, consistent with headgroups that exhibit similar dynamics regardless of their ionization state. Again, these observations are congruent with the differences in the ranges of allowed headgroup motion illustrated in FIG. 3B.

Divalent cations forming dicarboxylate-metal complexes. Divalent cations can form complexes with pairs of carboxylate ions. In the lying down phases examined here, complexation should reduce headgroup dynamics, resulting in higher contact angles, particularly at high pH. Previous work has indicated that the strength of such complexes can vary by up to an order of magnitude (from ~17 kJ/mol for $Cd^{2+}$ to 249 kJ/mol for $Ca^{2+}$), with trends in complex strength that are not dependent on ionic radius (i.e. smaller ions do not necessarily produce stronger complexes—$r(Cd^{2+})$=0.95 Å vs. $r(Ca^{2+})$=1.00 Å) (Bala, T. et al., *J. Phys. Chem. A* 2007, 111, 6183-6190).

Figure 5A:
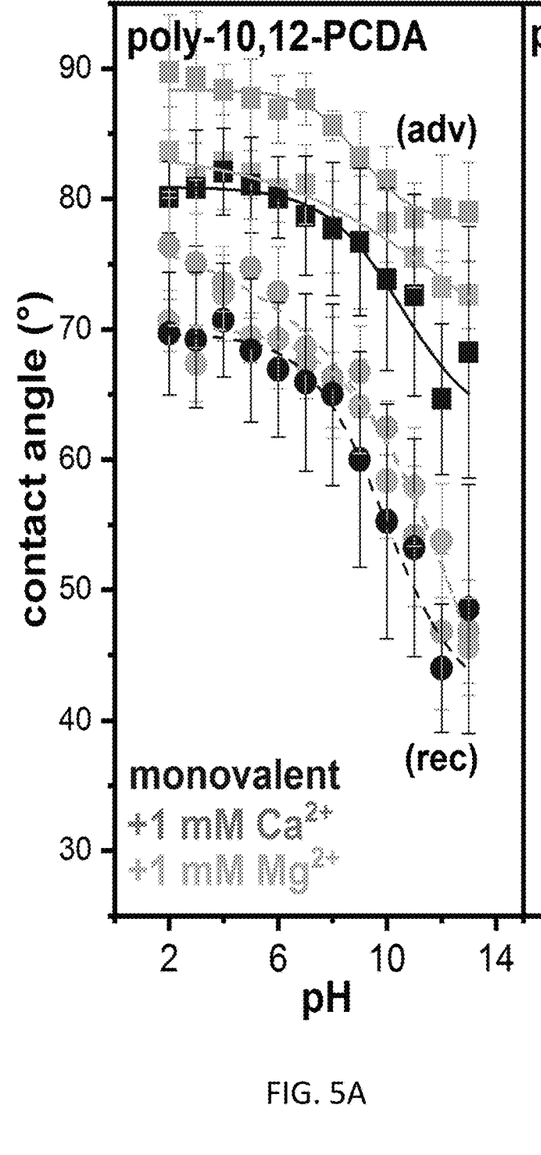
FIG. 5A shows contact angle titration data and sigmoidal curve fits for poly-10,12-PCDA
Figure 5B:
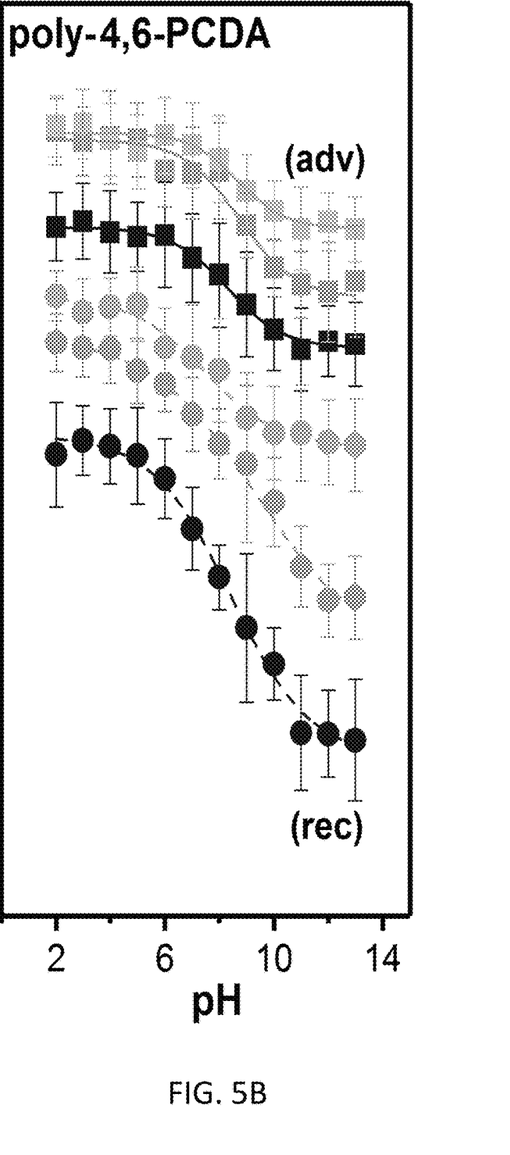
FIG. 5B shows contact angle titration data and sigmoidal curve fits for poly-4,6-PCDA in pH buffers containing monovalent cations (dark blue), and the same buffers with the addition of 1 mM $Ca^{2+}$ (light blue) or $Mg^{2+}$ (gold), wherein square markers indicate data for advancing angle (adv) measurements; circles indicate data for receding angles (rec)

FIGS. 5A and 5B show advancing (adv) and receding (rec) contact angle titrations for a series of buffers with or without the addition of 1 mM divalent metal chlorides ($CaCl_2$ or $MgCl_2$). Divalent ions have the overall impact of increasing contact angles, consistent with metal dicarboxylate complexes tethering pairs of headgroups in the plane of the monolayer and restricting dynamics. This effect is more pronounced for poly-4,6-PCDA monolayers, in which the headgroups are otherwise more accessible to solvent.

Figure 6A:
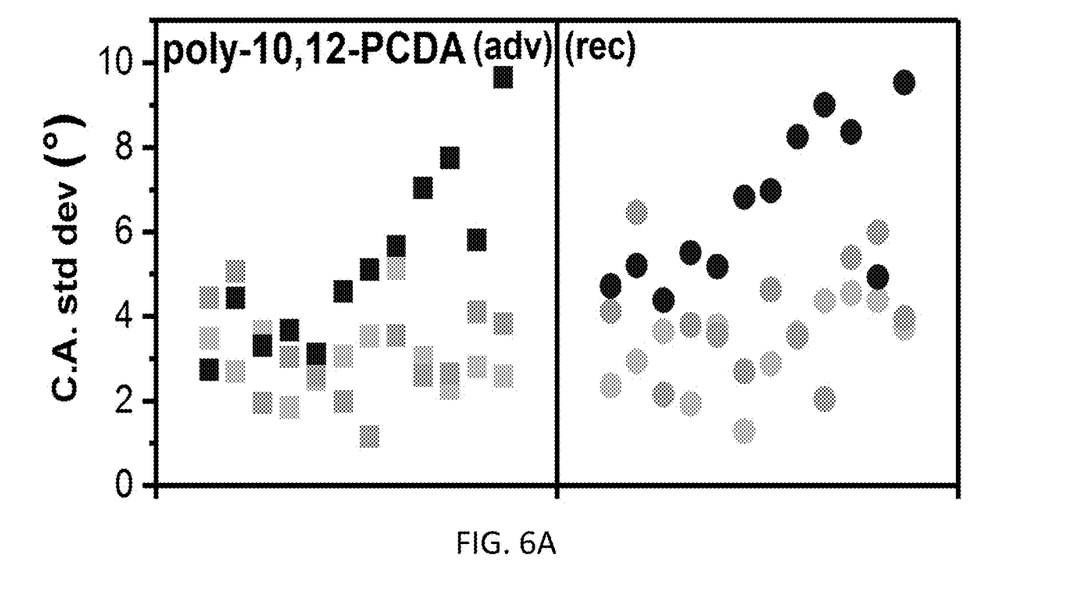
FIG. 6A shows standard deviations in advancing (adv) and receding (rec) contact angles for poly-10,12-PCDA
Figure 6B:
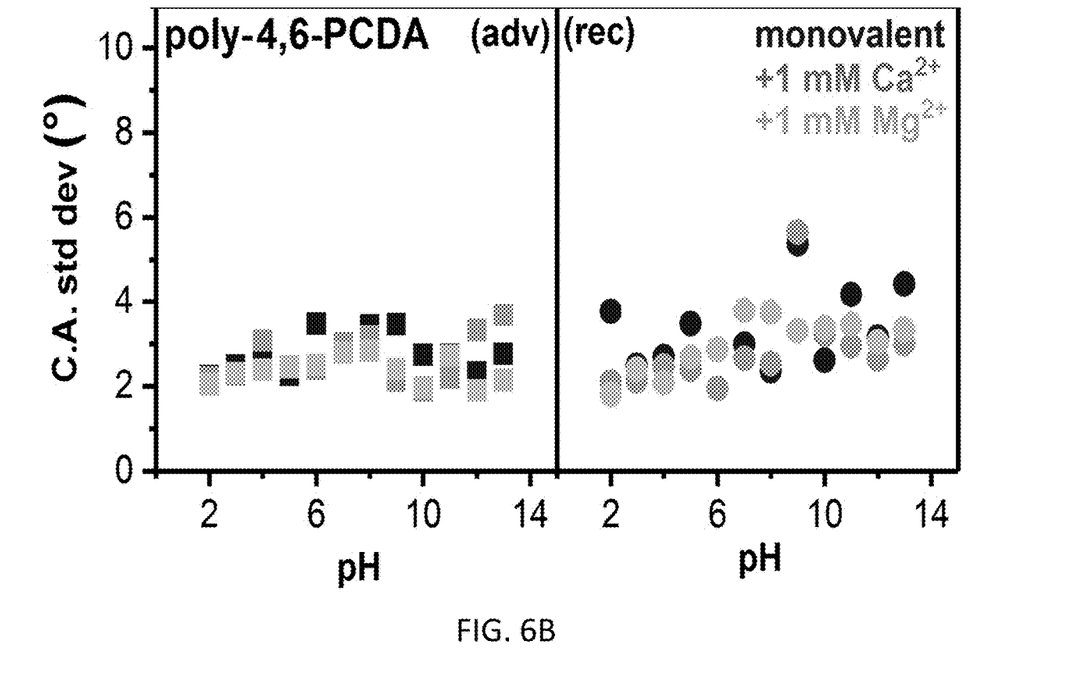
FIG. 6B shows standard deviations in advancing and receding contact angles for poly-4,6-PCDA in pH buffers containing monovalent cations (dark blue), and the same buffers with the addition of 1 mM $Ca^{2+}$ (light blue) or $Mg^{2+}$ (gold), wherein square markers indicate data for advancing angle (adv) measurements; circles indicate data for receding angles (rec).

Similarly, FIGS. 6A and 6B show that standard deviations in contact angle measurement decrease substantially for poly-10,12-PCDA with the addition of divalent ions. This would be consistent with a reduction in headgroup dynamics for the complexes in comparison with individual (particularly ionized) poly-10,12-PCDA headgroups. Overall, the standard deviations in contact angles for poly-4,6-PCDA are still smaller than those for poly-10,12-PCDA, consistent with the more limited range of headgroup motion.

The Young-Dupré model for wettability of surfaces with nanoscale chemical heterogeneity predicts that the contact angle should vary as a weighted average of the fractions of hydrophilic and hydrophobic surface chemistry. However, our studies demonstrate differences in wettability for lying-down monolayers of isomeric diynoic acids that differ only in the position of the polymerizable diyne group. That is, although the relative fractions of hydrophilic and hydrophobic functionalities present in the monolayers are the same, the monolayers wet differently based on both molecular structure and polymerization state, suggesting that the location of the diyne plays an important role in determining the interactions between the solvent and the polar headgroups.

Molecular dynamics simulations and contact angle titrations suggest that positioning the polymerizable group very near the headgroup decreases headgroup ordering, thereby increasing interactions with solvents and the environment. Effectively, this strategy converts a true 2D lying down phase into a 3D structure in which the headgroup is slightly elevated from the nonpolar layered material surface. More broadly, this suggests a strategy for designing interfaces in which the polymerization step that stabilizes the monolayer toward solvent also effects a structural change that selectively promotes interactions with solvents and analytes.

Experimental Methods

Materials. 4-Pentynoic acid (95% purity), 10,12-pentacosadiynoic acid (≥98%), iodine (99.8%), copper chloride (99.5%), morpholine (99%), potassium hydroxide, hydroxylamine hydrochloride (98%), ethylamine (70% (v/v) solution in water), sulfuric acid (95.0-98.0%), sodium thiosulfate, sodium bicarbonate, and sodium sulfate, were all purchased from Sigma Aldrich (St. Louis, Mo.) and used as received. 1-Eicosyne (95%) was purchased from GFS Chemicals (Powell, Ohio) and used as received. Methanol, diethyl ether (anhydrous), hexanes, heptane (99.0%), and toluene were purchased from Fisher Scientific (Hampton, N.H.) and used as received. Silica gel was purchased from Macherey-Nagel (Bethlehem, Pa.) and used as received. Fluka buffer solutions with unit pH values of 2-13 were purchased from Sigma Aldrich (St. Louis, Mo.) and used as received. AFM probes, type HQ:NSC18/AL BS, were purchased from Mikromasch (Watsonville, Calif.). Highly oriented pyrolytic graphite (HOPG) substrates, grade ZYB, were purchased from SPI Supplies (West Chester, Pa.). Milli-Q water (≥18.2 MΩ·cm resistivity) was used in all experiments.

Instrumentation. $^1$H NMR spectra were acquired using an INOVA Varian 300 MHz with a Varian 5-mm 4-nucleus/BB Z-gradient probe. All atomic force microscopy images were acquired utilizing a Veeco multimode AFM with NanoScope V controller (Veeco Instruments Inc., Plainview, N.Y.) or an Asylum Cypher ES AFM (Oxford Instruments, Santa Barbara, Calif.). Self-assembled monolayers of diacetylene-functionalized fatty acids were prepared on a KSV-NIMA Langmuir Blodgett trough (Biolin Scientific, Stockholm, Sweden). Contact angle titration experiments were carried out utilizing an Attension Theta optical tensiometer (Biolin Scientific, Espoo, Finland).

Procedure for synthesis of 1-iodo-1-eicosyne. Synthesis was carried out using a modification of previously published procedures (Phollookin, C. et al., *Macromolecules* 2010, 43, 7540-7548), described briefly here. In a typical reaction, a solution of morpholine (44 mmol) in toluene (34.8 mL) was treated with iodine (6.16 mmol), shielded from light and stirred for an hour at 45° C. A solution of 1-eicosyne (4.4 mmol) in toluene (3.48 mL) was then added and the reaction mixture stirred continuously at 45° C. for 1 hour. The reaction mixture was cooled to room temperature and filtered to remove the iodomorpholine salt. The filtrate was poured over a mixture of diethyl ether (50 mL) and a saturated aqueous solution of $Na_2S_2O_3$ (50 mL) and shaken until the organic layer was colorless. The organic layer was separated, washed again with a saturated aqueous solution of $Na_2S_2O_3$ (50 mL), dried over anhydrous $Na_2SO_4$, filtered, concentrated, and purified via column chromatography, with a solvent system of 100% hexane as an eluent, to afford 1-iodo-1-eicosyne as a colorless oil (typical yield ~70%).

Procedure for synthesis of 4,6-pentacosadiynoic acid. Synthesis was carried out using a modification of published procedure (Mowery, M., et al., *Tetrahedron Lett.* 1997, 38, 11-14; van den Heuvel, M., et al., *Biomacromol.* 2010, 11, 1676-1683), described briefly here. 4-Pentynoic acid (345 mg) was dissolved in a 1 M KOH solution (6 mL). Methanol (10 mL), hydroxylamine hydrochloride (23 mg), and a solution of CuI (82 mg) dissolved in a 70% (v/v) solution of ethylamine in water (10 mL). The reaction was then cooled to −78° C. A solution of 1-iodo-eicosyne (1.35 g) dissolved in THF (10 mL) was then added dropwise, causing a precipitate to form. The reaction was allowed to warm to room temperature and run for 24 hours. If the solution turned blue, additional aliquots of hydroxylamine hydrochloride were added to the reaction. The reaction was quenched by the addition of a 10% aqueous solution of sulfuric acid. Crude product was extracted with diethyl ether (3×50 mL) and then washed with water (3×50 mL) and brine (3×50 mL). The organic layer was dried over anhydrous $Na_2SO_4$, filtered, and the ether was removed by rotary evaporator. The crude product was purified by recrystallization from heptane to yield a fatty acid with an internal diyne, as a white solid (typical yield ~30%).

Diynoic acid monolayer preparation. Self-assembled monolayers of diacetylene-functionalized fatty acids were prepared via Langmuir-Schaefer (LS) transfer on a KSV-NIMA Langmuir-Blodgett trough. LS transfer of fatty acids was carried out by spreading 12 μL of 0.75 mg/mL 4,6- or 10,12-PCDA in CHCl$_3$ on a subphase of 18.2 MΩ·cm H$_2$O at 30° C. After the small amount of CHCl$_3$ used for fatty acid transfer was allowed to evaporate, trough barriers were swept inward (3 mm/min each barrier) to adjust the surface pressure. When the surface pressure reached the required dipping condition (30 Å$^2$/molecule), an automated dipper attachment on the LB trough was utilized to lower a freshly cleaved HOPG substrate onto the subphase (dip rate=2 mm/min) with the cleaved surface facing down. After 4 min in contact with the liquid interface, the HOPG was gently lifted out of contact with the liquid using the automated dipper. Samples were photopolymerized by irradiating for 1 hr under a 254-nm 8-W UV lamp with approximately 4 cm between the lamp and the sample surface.

Contact angle titrations. Contact angle titrations were performed using an Attension Theta optical tensiometer (Biolin Scientific, Espoo, Finland). Buffers with 20 mM buffering capacity at pH values from 2 to 13 were utilized. For each measurement, a 3 μL droplet of a buffer solution was applied to the functionalized HOPG substrate. The tensiometer recorded images at video rates as each droplet was applied to the surface (for the advancing angle measurement), and as liquid was slowly withdrawn from the droplet using a 32-gauge needle until the solvent front receded (for the receding angle measurement). Images were then analyzed using the OneAttension software package, in sessile droplet mode, based on the Young-Laplace equation. Each contact angle graphed in the paper represents the average of 9-27 data points (at least three points measured on each of three different samples). Typically, it was possible to acquire nine measurements in a grid across each 1 cm×1 cm sample.

Molecular modeling. Software packages Maestro and Macromodel (Schrödinger, Cambridge, Mass.) were used, respectively, to visualize the structures of fatty acids on graphene and to perform force field minimizations and molecular dynamics simulations. All models were simulated using the OPLS_2005 force field, with no solvent file and extended cutoffs for van der Waals, electrostatic, and hydrogen-bonding interactions. Minimizations were performed using the Polak-Ribiere conjugate gradient (PRCG) algorithm and gradient method with 50 000 runs and a convergence threshold of 0.05. Most minimizations converged in less than 10 000 runs. For all calculations, atoms in the graphene sheets were frozen, in order to more closely mimic the structure of HOPG. Thus, while they contributed to the forces present in the system, their positions did not change in response to conformational changes of the adsorbed fatty acids. For models demonstrating ionized head groups, simulations were performed either in explicit water or in vacuum as described in the manuscript.

Those skilled in the art will recognize that numerous modifications can be made to the specific implementations described above. The implementations should not be limited to the particular limitations described. Other implementations may be possible.

While the inventions have been illustrated and described in detail in the drawings and foregoing description, the same is to be considered as illustrative and not restrictive in character, it being understood that only certain embodiments have been shown and described and that all changes and modifications that come within the spirit of the invention are desired to be protected.

It is intended that the scope of the present methods and apparatuses be defined by the following claims. However, it must be understood that this disclosure may be practiced otherwise than is specifically explained and illustrated without departing from its spirit or scope. It should be understood by those skilled in the art that various alternatives to the embodiments described herein may be employed in practicing the claims without departing from the spirit and scope as defined in the following claims.

What is claimed is:

1. A method for modulating interfacial wettability of a two-dimensional (2D) material using a molecular layer prepared from a polymerizable amphiphilic monomer having a hydrophilic head and a hydrophobic tail, the method comprising the steps of
   a. preparing an amphiphilic monomer, allocating a proper position for the polymerizable group, relative to the hydrophilic head and the hydrophobic tail of said amphiphilic monomer;
   b. assembling a monolayer or thin film of said amphiphilic monomer; and
   c. polymerizing said amphiphilic monomer whereby affording said 2D material with a nanoscale enhanced or decreased wettability controlled by said amphiphilic monomer.

2. The method of claim 1, wherein said amphiphilic monomer incorporates a vicinal diyne as a polymerizable group at a proper position.

3. The method of claim 2, wherein said proper position for the polymerizable group relates to its position relative to said hydrophobic tail and hydrophilic head, which creates a proximal alkyl chain segment connecting the polymerizable group and the hydrophilic head, and a terminal chain segment connecting the polymerizable group and the end of the hydrophobic tail.

4. The method of claim 3, wherein decreased wettability is achieved when said hydrophobic tail has an about ten-carbon linear terminal alkyl chain segment.

5. The method of claim 3, wherein enhanced wettability is achieved by controlling the relative lengths of the proximal and terminal alkyl chain of said hydrophobic tail such that the hydrophilic head groups are disordered by the polymerization process.

6. The method of claim 5, wherein disordering the hydrophilic head groups is achieved by positioning the polymerizable group of said amphiphilic monomer close to said head groups.

7. The method of claim 1, wherein polymerization of an amphiphilic monolayer or thin film is performed by irradiating the monolayer or thin film with an UV light.

8. A monolayer or thin film prepared according to the method of claim 1.

9. A device containing the monolayer or thin film of claim 8.

10. The monolayer or thin film of claim 8, wherein said monolayer or thin film is transferrable.

11. A method for modulating interfacial wettability of a 2D material using a molecular film prepared from a vicinal diyne amphiphilic monomer having a hydrophilic head and a hydrophobic tail, wherein said hydrophilic head is a carboxylic acid, the method comprising the steps of
    a. preparing a vicinal diyne amphiphilic monomer having a hydrophilic head and a hydrophobic tail;
    b. assembling a monolayer or thin film of said amphiphilic monomer;
    c. polymerizing said monolayer or thin film whereby affording a 2D material with enhanced or decreased wettability; and
    d. adjusting pH of said amphiphilic monolayer and/or chelating said carboxylic acid functionality with a divalent cation to further control head group ordering.

12. The method of claim 11, wherein reduced wettability (enhanced hydrophobicity) of said 2D material is achieved by adjusting said pH value downward using an acid.

13. The method of claim 11, wherein increased wettability (enhanced hydrophilicity) of said 2D material is achieved by adjusting said pH value upward using a base.

14. The method of claim 11, wherein enhanced hydrophobicity (reduced wettability) of said 2D material is achieved by adding a divalent cation to chelate said carboxylic acid functionality.

15. The method of claim 11, wherein enhanced hydrophobicity (reduced wettability) of said 2D material is achieved by adding a divalent cation selected from the group consisting of $Ca^{2+}$, $Mg^{2+}$, $Ba^{2+}$, $Cu^{2+}$, $Co^{2+}$, $Ni^{2+}$, $Zn^{2+}$, $Mn^{2+}$, $Pb^{2+}$, $Cd^{2+}$, and $Fe^{2+}$.

16. The method of claim 11, wherein polymerization of an amphiphilic monolayer or thin film is performed by irradiating said monolayer or thin film with an UV light.

17. A monolayer or thin film prepared according to the method of claim 11.

18. A device containing the monolayer or thin film of claim 17.

19. The monolayer or thin film of claim 17, wherein said monolayer or thin film is transferrable.

* * * * *